(12) United States Patent
Ouyang

(10) Patent No.: US 9,350,340 B2
(45) Date of Patent: May 24, 2016

(54) POWER LOSS CONTROL METHOD FOR METAL-OXIDE-SEMICONDUCTOR UNIT AND ASSOCIATED APPARATUS

(75) Inventor: Qian Ouyang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 906 days.

(21) Appl. No.: 13/571,142

(22) Filed: Aug. 9, 2012

(65) Prior Publication Data

US 2013/0038316 A1 Feb. 14, 2013

(30) Foreign Application Priority Data

Aug. 9, 2011 (CN) .......................... 2011 1 0230476

(51) Int. Cl.
*H02M 3/156* (2006.01)
*H03K 17/12* (2006.01)
*H03K 17/06* (2006.01)
*H02M 3/158* (2006.01)
*H02M 1/00* (2006.01)

(52) U.S. Cl.
CPC ............. *H03K 17/122* (2013.01); *H02M 3/158* (2013.01); *H03K 17/063* (2013.01); *H02M 2001/0032* (2013.01); *H02M 2001/0048* (2013.01); *H03K 2217/0036* (2013.01); *Y02B 70/1491* (2013.01); *Y02B 70/16* (2013.01)

(58) Field of Classification Search
CPC .............. H02M 3/156; H02M 3/1588; H02M 2001/0032; H02M 2001/0048; G05F 3/18; G05F 3/22; G05F 1/56
USPC .............................. 323/271, 282, 311; 327/81
See application file for complete search history.

(56) References Cited

U.S. PATENT DOCUMENTS 5,969,514 A * 10/1999 Merrill .......................... 323/283
8,129,763 B2   3/2012 Bjoerk et al.

* cited by examiner

*Primary Examiner* — Yemane Mehari
(74) *Attorney, Agent, or Firm* — Perkins Coie LLP

(57) ABSTRACT

A power loss control method comprises detecting a load condition of the MOS unit, and adjusting driving loss of the MOS unit based on the load condition. The driving loss of the MOS unit is configured to decrease when the MOS unit is at light load condition.

17 Claims, 6 Drawing Sheets

US 9,350,340 B2

POWER LOSS CONTROL METHOD FOR METAL-OXIDE-SEMICONDUCTOR UNIT AND ASSOCIATED APPARATUS

CROSS-REFERENCE TO RELATED APPLICATION(S)

This application claims the benefit of CN application No. 201110230476.0, filed on Aug. 9, 2011, and incorporated herein by reference.

TECHNICAL FIELD

This invention relates generally to semiconductor devices, and more particularly but not exclusively to metal-oxide-semiconductor devices.

BACKGROUND

Recently, Metal-Oxide-Semiconductor (MOS) devices are widely used in digital circuits and analog circuits per their advantages on high switching speed, low power loss, and low cost. One of the most common MOS devices by far is the Metal-Oxide-Semiconductor Field Effect Transistor (MOSFET). When MOSFET is turned on, current can flow through the device, and when MOSFET is turned off, current can be blocked. A MOS unit comprising a plurality of MOSFETs can be employed for switching, regulating voltage, regulating current and so on.

MOSFET comprises three terminals, gate (G), source (S) and drain (D). MOSFET can be turned on or off via controlling gate voltage. Power loss is produced during MOSFET's ON period and OFF period.

Generally speaking, the power loss produced by MOSFET comprises three parts. The first part is driving loss which is generated by charging and discharging a gate capacitor. Driving loss is related with gate charge Qg, gate voltage VDD and switching frequency Fsw. The second part is switching loss which is related with input voltage Vin, turning-on time period Ton, turning-off time period Toff, load current IO and switching frequency Fsw. The third part is conduction loss which is caused by current flowing through MOSFET when the MOSFET is on. Conduction loss is related with on-resistance Rdson of MOSFET.

For apparatus comprising a MOS unit, switching loss and conduction loss are dominant in total power loss of the MOS unit when the apparatus operates under a heavy load. Conventional method to reduce switching loss and conduction loss is to decrease the on-resistance Rdson of the MOS unit, e.g., increasing parallel MOS devices to reduce the total conduction impedance of the MOS unit.

But gate capacitance increases when on-resistance Rdson decreases. As a result, driving loss increases. More specifically, when the number of parallel MOS devices increases, gate area and gate charge increases accordingly, and driving loss increases. However, driving loss is dominant in total power loss of the MOS unit when the apparatus works at light load and there is a conflict for decreasing power loss or increasing efficiency between light load and heavy load.

Some apparatuses, e.g., television, air-conditioning and so on, may maintain standby mode or low power mode within a long time period, and the internal MOS unit may work at light load within a long time period accordingly. As a result, a control method or apparatus for MOS unit is needed to achieve lower power loss at both light load and heavy load.

SUMMARY

It is one of the objects of the present disclosure to provide a MOS unit to achieve lower power loss at both light load and heavy load. Embodiments of the present disclosure are to provide a power loss control method and apparatus for a MOS unit.

In one embodiment, the present disclosure is configured to adjust driving loss of a MOS unit based on a load condition. Total power loss of the MOS unit at heavy load and light load may decrease via adjusting driving loss of the MOS unit.

In one embodiment, a power loss control method for a MOS unit is disclosed. The power loss control method may comprise: detecting a load condition of the MOS unit; adjusting driving loss of the MOS unit based on the load condition via controlling the MOS unit.

In one embodiment, a power loss control apparatus for a MOS unit is disclosed. The power loss control apparatus may comprise: a load condition detecting device, configured to detect a load condition of the MOS unit; and a power loss controlling device, configured to adjust driving loss of the MOS unit based on the load condition.

In one embodiment, the driving loss is adjusted based on the load condition of the MOS unit. The present invention discloses that share of the driving loss in the total power loss is varied with the load condition. The MOS unit may be configured to reduce driving loss at light load condition, and the MOS unit may maintain or resume an initial configuration at heavy load condition.

The MOS unit may have both optimized efficiency at both heavy load and light load via adjusting the driving loss based on the load condition.

These and other features of the present invention will be readily apparent to persons of ordinary skill in the art upon reading the entirety of this disclosure, which includes the accompanying drawings and claims.

BRIEF DESCRIPTION OF THE DRAWINGS

For a better understanding of the aforementioned embodiments of the invention as well as additional embodiments thereof, reference should be made to the description of embodiments below, in conjunction with the following drawings.

Figure 1:
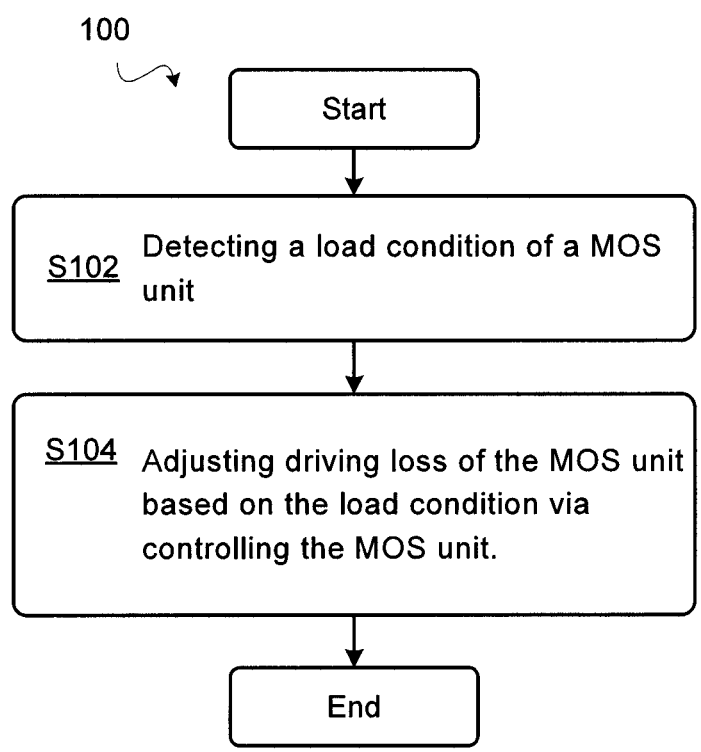
FIG. 1 shows a flow chart illustrating a method for regulating power loss of a MOS unit in accordance with an embodiment of the present invention.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Several embodiments of the present invention are described below. As used hereinafter, the term "couple" generally refers to multiple ways including a direct connection with an electrical conductor and an indirect connection through intermediate diodes, resistors, capacitors, and/or other intermediaries. The term "MOS device" generally refers to a device mostly comprising Metal-Oxide-Semiconductor (MOS). In some embodiments of the present invention, MOS device may include but not limited to Metal-Oxide-Semiconductor Field Effect Transistor (MOSFET). The term "MOS unit" generally refers to a circuit unit comprising a plurality of MOS devices (e.g., MOSFETs), wherein the MOS devices may be coupled in series, in parallel or in parallel-series. Step-down converter may employ MOS unit as master switch and/or freewheel switch. The term "heavy load condition" generally refers to a load condition at which load current of MOS unit is higher than an anticipative current. In some embodiments, MOS unit is at heavy load condition when a device comprising MOS unit works normally. The term "light load condition" generally refers to a load condition at witch load current is lower than the anticipative current. In some embodiments, MOS unit is at light load condition when a device comprising MOS unit works at low power mode, e.g., standby mode.

Power Loss of MOS Unit Analysis

As aforementioned, power loss of MOS unit may comprise three parts: driving loss, switching loss and conduction loss. Switching loss and conduction loss are dominant when MOS unit is at heavy load condition, and driving loss is dominant when MOS unit is at light load condition. Step-down converter comprising a master MOS unit (as high-side switch) and a freewheel MOS unit (as low-side switch) is employed and would be described below as one example.

Table 1 shows experimental results indicating variation of power loss with load current IO. In one embodiment, the master MOS unit comprises a plurality of MOSFETs coupled in parallel, on-resistance of the master MOS unit is about 30 milliohm, and gate charge of the master MOS unit is about 5 nano-coulomb. In one embodiment, the freewheel MOS unit comprises a plurality of MOSFETs coupled in parallel, on-resistance of the freewheel MOS unit is about 10 milliohm, and gate charge of the freewheel MOS unit is about 15 nano-coulomb. As shown in Table 1, driving loss accounts for about 3.6% of total power loss when load current IO is about 10 amperes. Driving loss accounts for a growing share when load current IO decreases, and driving loss is about 89.2% when load current IO decreases to about 0.1 amperes.

TABLE 1

| Load Current | Driving Loss | Switching Loss | Conduction Loss | Total Power Loss |
| --- | --- | --- | --- | --- |
| IO = 10 A | 80 mW<br>3.6% | 960 mW<br>42.9% | 1200 mW<br>53.6% | 2240 mW<br>100% |
| IO = 2 A | 80 mW<br>25% | 192 mW<br>60% | 48 mW<br>15% | 320 mW<br>100% |
| IO = 0.5 A | 80 mW<br>61.1% | 48 mW<br>36.6% | 3 mW<br>2.3% | 131 mW<br>100% |
| IO = 0.1 A | 80 mW<br>89.2% | 9.6 mW<br>10.7% | 0.12 mW<br>0.134% | 89.72 mW<br>100% |

Obviously, total power loss of MOS unit may decrease via reducing switching loss and conduction loss at heavy load condition. Conventional method is to reduce on-resistance of MOS unit at heavy load condition. But as a consequence, gate charge and driving loss would increase which would introduce higher total power loss at light load condition.

It is assumed in the following description that MOS unit is designed and fabricated as to insure lower power loss at heavy load condition.

Power Loss Control Method for MOS Unit

It is an object of the present disclosure to provide a solution solving the conflict between driving loss at light load condition, and switching loss and conduction loss at heavy load condition. FIG. 1 shows a flow chart illustrating a method 100 for regulating power loss of a MOS unit in accordance with an embodiment of the present invention.

First, detecting a load condition of the MOS unit at step S102. In one embodiment, the load condition may be detected via monitoring working state of a major device comprising the MOS unit. In other embodiments, the load condition may be detected via any other suitable method.

The aforementioned major device may refer to a device comprising the MOS unit or related with the MOS unit. In one embodiment, the load condition may be detected via monitoring a power status indicator (PSI) signal of the major device. Central processing unit (CPU) of the major device may indicate working state of the major device. In one embodiment, it should be noted that the MOS unit is at light load condition when the major device is at low power state, e.g., standby, and it should be noted that the MOS unit is at heavy load condition when the major device is at high power state.

Figure 3:
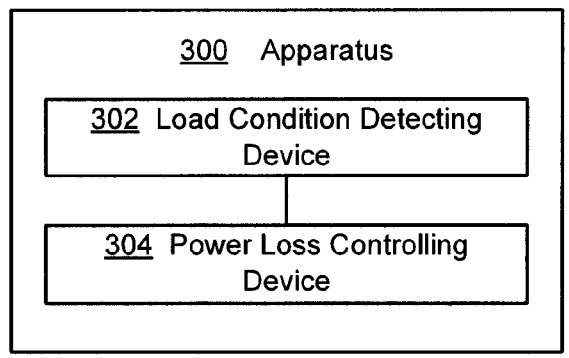
FIG. 3 schematically illustrates a block diagram of an apparatus for regulating power loss of a MOS unit in accordance with an embodiment of the present invention.

In one embodiment, working state of the major device is periodically checked, and a time period between adjacent check points may be configurable. In another embodiment, working state of the major device is checked during interruption. For example, the PSI signal generated by CPU of the major device is provided to a device performing method 100 (e.g., apparatus 300 as shown in FIG. 3) during interruption. Persons of ordinary skill in the art should know that the PSI signal is employed as one example, and any other suitable technique solution used to indicate working state of the major device could be employed for detecting the load condition.

In one embodiment, the load condition is detected via monitoring an electrical parameter of the MOS unit. For example, measuring load current of the MOS unit and comparing the measured load current with a threshold current signal. The MOS unit is recognized as at heavy load condition when the measured load current is larger than the threshold current signal, and the MOS unit is recognized as at light load condition when the measured load current is smaller than the threshold current signal. The threshold current signal may be preset or adjustable. Any other suitable electrical parameters may be monitored for detecting the load condition of the MOS unit.

Step S102 may comprise but not limited to the aforementioned embodiments. Any other suitable method may be employed for detecting the load condition of the MOS unit.

At step S104, The MOS unit is controlled to adjust driving loss of the MOS unit based on the load condition. As shown in Table 1, driving loss accounts for different share with the load condition. Method 100 is employed to adjust driving loss of the MOS unit based on the load condition, and in consequence, to decrease total power loss at light load condition and heavy load condition.

Figure 2:
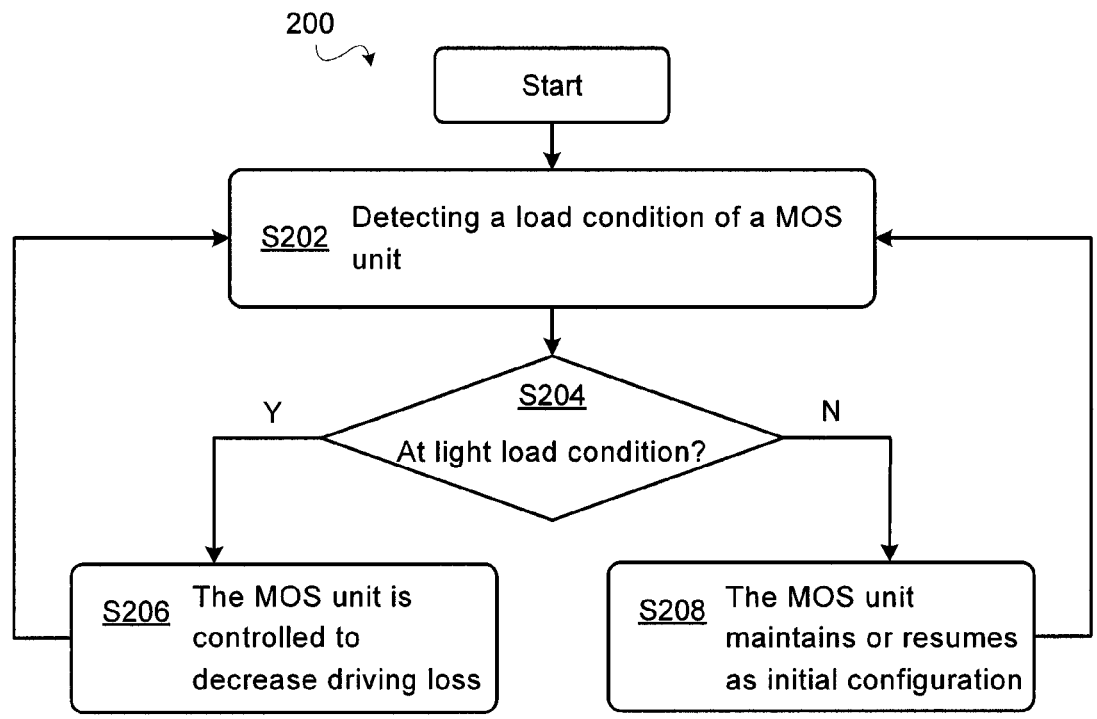
FIG. 2 shows a flow chart illustrating a method for regulating power loss of a MOS unit in accordance with another embodiment of the present invention.

FIG. 2 shows a flow chart illustrating a method 200 for regulating power loss of a MOS unit in accordance with another embodiment of the present invention.

First, detecting the load condition of the MOS unit at step S202. In one embodiment, detecting the load condition may comprise monitoring working state of the major device or an electrical parameter of the MOS unit.

Next, judging whether the MOS unit is at light load condition at step S204. If the MOS unit is at heavy load condition, then goes to step S208 (S204-No, S208). The MOS unit has initial configuration at step S208. In one embodiment, initial configuration of the MOS unit is configured for lower switching loss and conduction loss. While switching loss and conduction loss are dominant at heavy load condition, initial configuration of the MOS unit at step S208 may be benefit to achieve lower total power loss.

In one embodiment, if the MOS unit has configured as initial configuration before going into step S208 (e.g., at heave load condition before jumping to step S208), then the MOS unit maintains initial configuration at step S208. Otherwise, e.g., when transits from light load condition to heavy load condition, the MOS unit should resume initial configuration at step S208. In other words, step S208 comprises maintaining or resuming initial configuration of the MOS unit.

At step S204, if the MOS unit is at light load condition, then go to step S206 (S204-Yes, S206). Driving loss of the MOS unit is configured to decrease via controlling the MOS unit at step S206. While driving loss is dominant at light load condition, total power loss of the MOS unit may be reduced via decreasing driving loss at step S206.

The MOS unit may comprise a plurality of MOS devices (e.g., MOSFETs) coupled in parallel. In one embodiment, step S206 comprises shielding one or more MOS devices of the MOS unit. The word "shield" refers to logically bypass or remove one or more MOS devices. The MOS unit would comprise less quantity of effective MOS devices via shielding one or more MOS devices, and gate area and gate charge of the MOS unit decrease. In consequence, driving loss decreases.

Figure 5A:
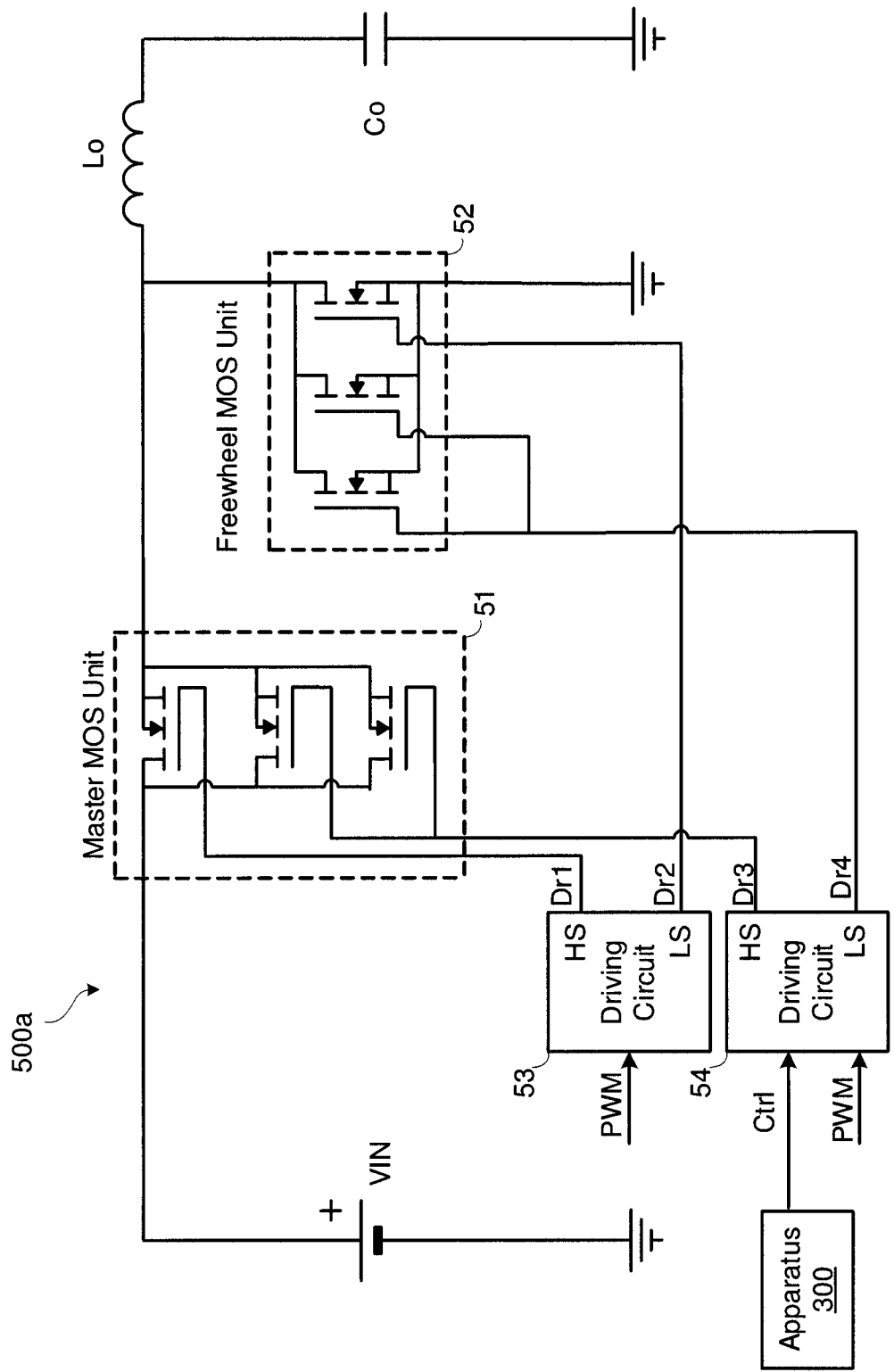
FIG. 5A schematically illustrates a circuit in accordance with an embodiment of the present invention.

There are many methods to shield one or more MOS devices of the MOS unit. In one embodiment, MOS devices are shielded via deactivating corresponding driving signals, i.e., one or more MOS devices are logically removed. More specifically, more than one driving circuits are coupled to the MOS unit. At step S206, some driving circuits may be configured to provide deactivated driving signals to one or more MOS devices and some other driving circuits may be configured to provide activated driving signals to one or more MOS devices. As a result, driving signals are deactivated to shield corresponding one or more MOS devices. FIG. 5A shows an example circuit. In another embodiment, a driving circuit is coupled to the MOS unit to provide an original driving signal, and a multiplexer is configured to receive the original driving signal and is configured to provide a plurality of final driving signals to MOS devices of the MOS unit. Some final driving signals may be configured deactivated to shield corresponding MOS devices.

Persons of ordinary skill in the relevant art should recognize that the aforementioned embodiments provide some examples of step S206, and other suitable methods may be employed to shield one or more MOS devices, e.g., turning off one or more MOS devices.

Figure 5B:
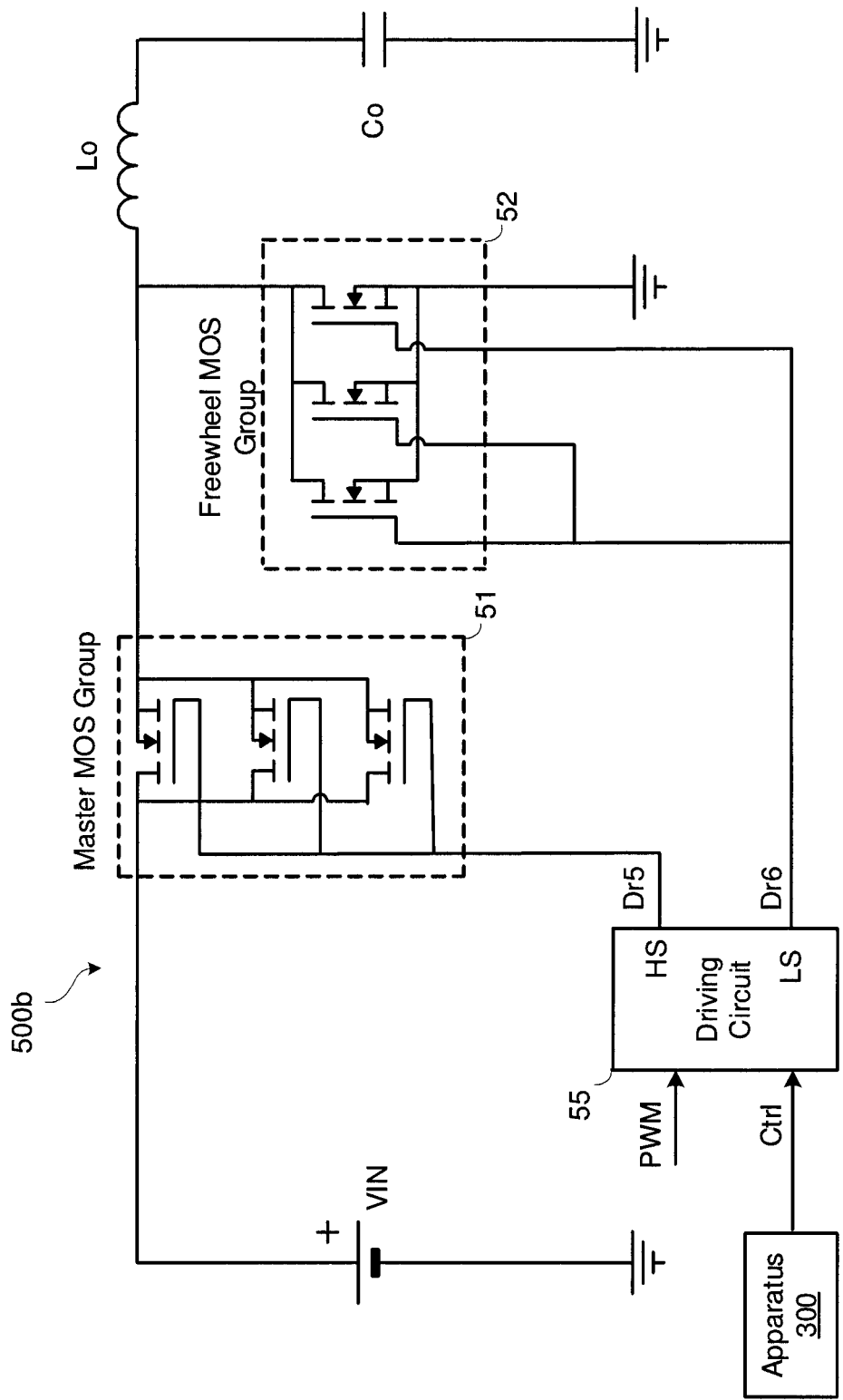
FIG. 5B schematically illustrates a circuit in accordance with another embodiment of the present invention.

In one embodiment, at step S206, driving loss may be decreased via decreasing voltage of driving signals coupled to the MOS unit. FIG. 5B shows an example circuit.

It should be recognized that shielding one or more MOS devices and/or decreasing voltage of driving signals are only as examples to decrease driving loss at light load condition and should not limit the present invention into the specific embodiments.

In one embodiment, method 200 jumps to step S202 after step S206 and detects the load condition of the MOS unit continuously.

Then, if the MOS unit transits from light load condition to heavy load condition at step S204, the MOS unit resumes initial configuration at step S208 (S204-No, S208). More specifically, if one or more MOS devices are shielded at step S206, then release corresponding shielded one or more MOS devices at step S208. In one embodiment, if driving signals are deactivated to shield one or more MOS devices at step S206, then the deactivated driving signals are activated at step S208. In another embodiment, if voltage of a driving signal is decreased at step S206, then increase voltage of the driving signal back to initial level at step S208.

In one embodiment, method 200 jumps to step S202 after step S208 to detect the load condition of the MOS unit. As a result, the MOS unit is continuously monitored and controlled.

As the foregoing method 100 and method 200, embodiments of the present invention control the MOS unit based on the load condition to achieve lower power loss at both light load condition and heavy load condition. More specifically, decreasing driving loss at light load condition as possible is via controlling the MOS unit, and decreasing switching loss and conduction loss at heavy load condition is via maintaining or resuming initial configuration of the MOS unit.

The foregoing described methods may be implemented via a hardware module. For example, the hardware module may include but not limited to Application Specific Integrated Circuit (ASIC), Field Programmable Gate Array (FPGA) and other programmable logic device. The hardware module would implement methods or processes loaded on when the hardware module is activated.

In one embodiment, the foregoing described methods may be implemented as program code and/or data stored on a computer readable storage media. Computer is configured to implement methods or processes stored as program code and/or date on the computer readable storage media.

Power Loss Control Apparatus for MOS Unit

FIG. 3 schematically illustrates a block diagram of an apparatus 300 for adjusting power loss of a MOS unit in accordance with an embodiment of the present invention. Apparatus 300 may be one of an executive entity of method 100 and method 200. In one embodiment, a driving circuit is coupled to the MOS unit to adjust power loss. Apparatus 300 may be coupled to an input of the driving circuit or be employed as one part of the driving circuit.

Apparatus 300 comprises load condition detecting device 302 and power loss controlling device 304. Load condition detecting device 302 is configured to detect the load condition of the MOS unit. Power loss controlling device 304 is configured to adjust driving loss of the MOS unit based on the load condition.

In one embodiment, power loss controlling device 304 comprises driving loss controlling device which is configured to decrease driving loss via controlling the MOS unit when the MOS unit is at light load condition. The MOS unit may comprise a plurality of MOS devices coupled in parallel. In one embodiment, the driving loss controlling device comprises a shielding device, which is configured to shield one or more MOS devices of the MOS unit at light load condition. The shielding device may be configured to deactivate one or more driving signals to shield one or more MOS devices. The driving loss controlling device may further comprise a shield release device which is configured to release the shielded MOS devices when the MOS unit transits from light load condition to heavy load condition.

In one embodiment, the driving loss controlling device may comprise a driving voltage controlling device which is configured to decrease voltage of a driving signal of the MOS unit at light load condition. The driving voltage controlling device is further configured to increase voltage of the driving signal of the MOS unit to initial voltage level when the MOS unit transits from light load condition to heavy load condition.

In one embodiment, load condition detecting device 302 is configured to detect load condition via monitoring working state of a major device or an electrical parameter of the MOS unit. In another embodiment, load condition detecting device 302 is configured to receive working state of the major device or the electrical parameter of the MOS unit from other device.

Each device of apparatus 300 is corresponding to steps of method 100, and the foregoing character and operation described in method 100 could be applied to apparatus 300. Apparatus 300 comprises but not limited to device 302 and device 304 as one example. In one embodiment, device 302 or device 304 may be replaced by a plurality of devices. In another embodiment, device 302 and device 304 may be replaced by a single device.

Apparatus 300 may be implemented via hardware, software, firmware and/or any other suitable combination of the three. In one embodiment, apparatus 300 may be implemented via software and/or firmware module. In another embodiment, apparatus 300 may be implemented via hardware module, e.g., Integrated Circuit (IC), Application Specific Integrated Circuit (ASIC), Field Programmable Gate Array (FPGA) and other suitable devices.

Figure 4:
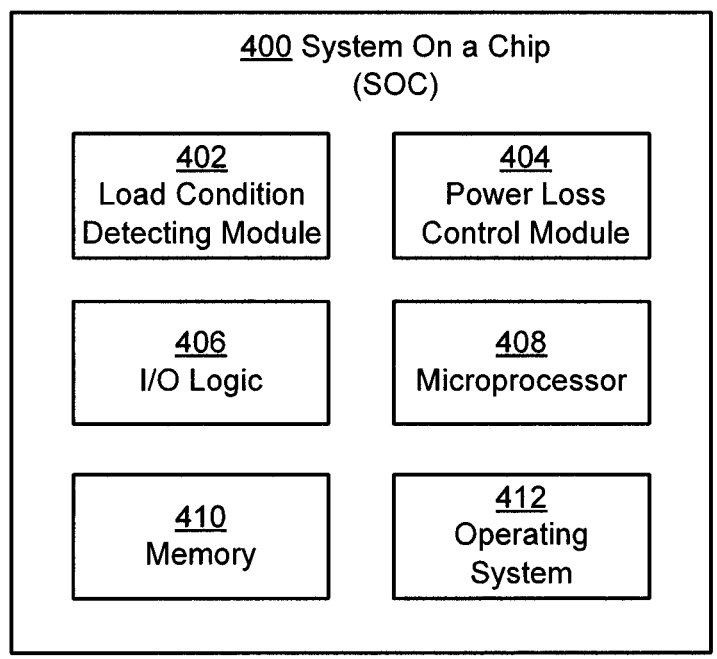
FIG. 4 schematically illustrates a block diagram of a system on a chip (SOC) for the apparatus shown in FIG. 3 in accordance with an embodiment of the present invention.

FIG. 4 schematically illustrates a block diagram of a system on a chip (SOC) 400 for apparatus 300 shown in FIG. 3 in accordance with an embodiment of the present invention. SOC 400 may comprise electronic circuits, microprocessor, memory, input-output (I/O) logic, communication interface, and any other suitable hardware/firmware/software. SOC 400 may further comprise data bus which is coupled to each module of SOC 400 and is configured to transfer data between different modules.

As shown in FIG. 4, SOC 400 comprises I/O logic 406 (e.g., comprising electronic circuits), microprocessor 408 (e.g., microcontroller, or digital signal processor) and memory 410 which may be Random Access Memory (RAM), Nonvolatile Memory (NVM, e.g., flash memory), Read-Only Memory (ROM) and/or any other suitable electronic data memory. SOC 400 may further comprise various firmware/software, e.g., operating system 412, communication interface, network interface, and other hardware. Operating system 412 may be computer executable instruction and may be maintained by memory 410 and executed by microprocessor 408.

As shown in FIG. 4, SOC 400 may further comprise load condition detecting module 402 and power loss control module 404. Load condition detecting module 402 is configured to detect load condition of the MOS unit. Power loss control module 404 is configured to adjust driving loss of the MOS unit based on the load condition. In one embodiment, load condition detecting module 402 and power loss control module 404 may be independent or cooperating with other circuit, e.g., signal processing circuit or control circuit.

Examples of Application Circuits of MOS Unit

FIG. 5A schematically illustrates a circuit 500a in accordance with an embodiment of the present invention.

Circuit 500a employs step-down converter topology as an example. As shown in FIG. 5A, a master MOS unit 51 comprises a plurality of MOSFETs coupled in parallel, and a freewheel MOS unit 52 comprises a plurality of MOSFETs coupled in parallel. Apparatus 300 is employed as a control circuit. Circuit 500a comprises two separated driving circuits 53 and 54.

In one embodiment, driving circuit 53 is configured to receive a pulse signal PWM and is configured to provide a driving signal Dr1 and a driving signal Dr2. Driving signal Dr1 is coupled to a MOSFET of master MOS unit 51, and driving signal Dr2 is coupled to a MOSFET of freewheel MOS unit 52. Driving circuit 54 is configured to receive pulse signal PWM and is coupled to apparatus 300 to receive a control signal Ctrl, and driving circuit 54 is configured to provide a driving signal Dr3 and a driving signal Dr4. Driving signal Dr3 is coupled to some MOSFETs of master MOS unit 51, and driving signal Dr4 is coupled to some MOSFETs of freewheel MOS unit 52. Driving circuit 54 is configured to provide deactivated driving signals Dr3 and Dr4 when control signal Ctrl indicates that circuit 500a is at light load condition. As a result, corresponding MOSFETs in master MOS unit 51 and freewheel MOS unit 52 are shielded, e.g., turned off, and then driving loss decreases at light load condition, per gate charge of master MOS unit 51 and freewheel MOS unit 52 decreases.

Driving circuit 54 is configured to provide activated driving signals Dr3 and Dr4 when control signal Ctrl indicates that circuit 500a is at heavy load condition. As a result, corresponding shielded MOSFETs in master MOS unit 51 and freewheel MOS unit 52 are released, e.g., turned on, and then on-resistance of master MOS unit 51 and freewheel MOS unit 52 decreases. As a consequence, switching loss and conduction loss decrease at heavy load condition.

FIG. 5B schematically illustrates a circuit 500b in accordance with another embodiment of the present invention. The difference between circuit 500b and circuit 500a is that a driving circuit 55 is employed instead of driving circuit 53 and driving circuit 54. Apparatus 300 is coupled to driving circuit 55 to provide control signal Ctrl. Driving circuit 55 is configured to provide driving signal Dr5 to master MOS unit 51 and driving signal Dr6 to freewheel MOS unit 52. Voltage of driving signal Dr5 and voltage of driving signal Dr6 decrease when control signal Ctrl indicates that circuit 500b is at light load condition. In one embodiment, driving voltage for each MOSFETs in master MOS unit 51 and freewheel MOS unit 52 decreases. As a result, driving loss decreases. Then driving voltage for each MOSFETs in master MOS unit 51 and freewheel MOS unit 52 increases to initial level when control signal CTRL indicates that circuit 500b transits from light load condition to heavy load condition.

It should be recognized that the present invention employs circuit 500a and circuit 500b as examples. However, the specific discussions above are not intended to be exhaustive or to limit the present invention to the precise forms disclosed. Many modifications and variations are possible in view of the above teachings. Circuit 500a and circuit 500b employ step-down topology as one example, and any other suitable topology comprising one or more MOS units may be employed.

Figure 6:
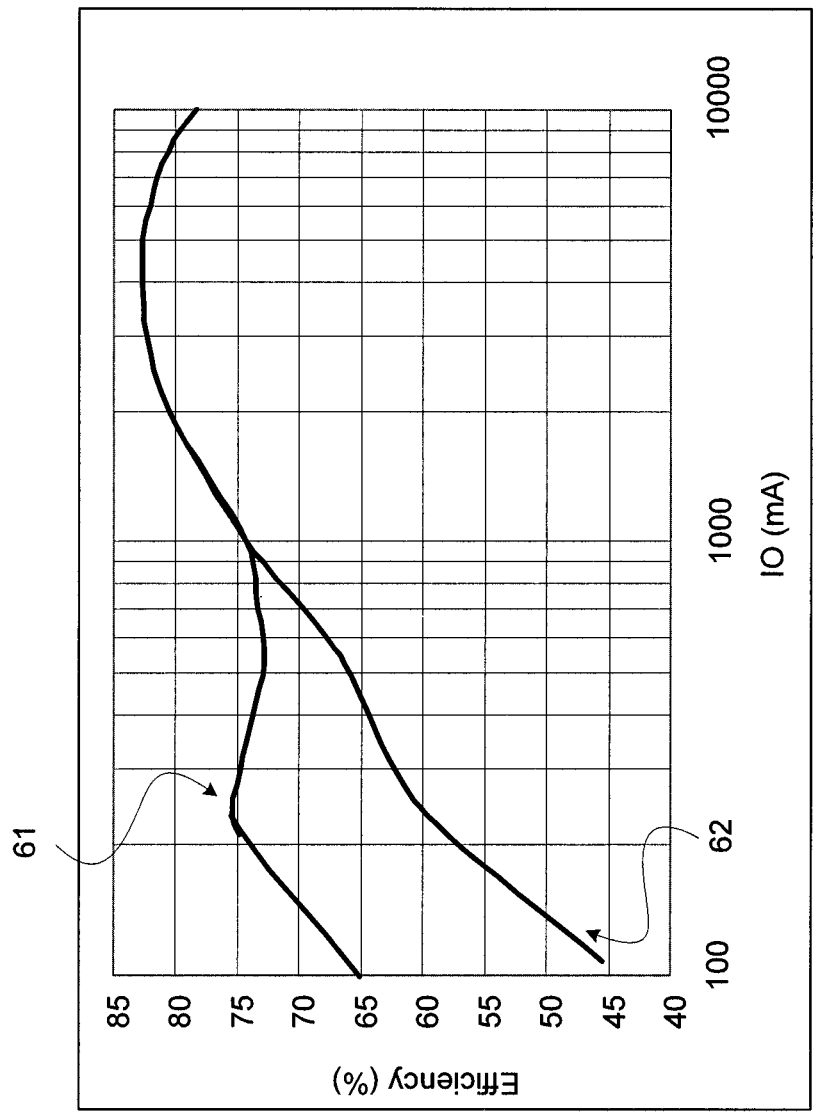
FIG. 6 shows a diagram indicating experimental results in accordance with an embodiment of the present invention.

FIG. 6 shows a diagram indicating experimental results in accordance with an embodiment of the present invention. As shown in FIG. 6, Y-axis indicates efficiency, i.e., ratio of output power to input power, X-axis indicates load current IO of a test circuit. As shown in FIG. 6, curve 61 indicates efficiency of circuit 500a and curve 62 indicates efficiency of conventional step-down circuit. As shown in FIG. 6, curve 61 has higher efficiency than curve 62 at light load condition and has the same efficiency with curve 62 at heavy load condition. More specifically, curve 61 achieves an efficiency about 20% higher than curve 62 when load current IO is about 0.1 amperes.

Brief Summary of the Embodiments

The above description and discussion about specific embodiments are illustrated for understanding of the present invention. Driving loss is adjusted base on the load condition of the MOS unit in accordance with an embodiment of the present invention. Driving loss is configured to decrease via controlling the MOS unit at light load condition, and switching loss and conduction loss are configured to decrease via maintaining or resuming initial configuration of the MOS unit at heavy load condition.

The advantage of adjusting driving loss of the MOS unit based on the load condition is to achieve lower power loss at light load condition and keep high performance at heavy load condition. In this way, it is easier to achieve better efficiency at both light load and heavy load via controlling the MOS unit.

It should be noted that the steps illustrated in aforementioned flow charts or block diagrams may be not implemented in the sequence as shown. For example, two successive blocks may be implemented simultaneously or in a reverse order as shown based on related specific function. Each step in aforementioned flow charts and/or each block in aforementioned block diagrams may be implemented via hardware system or combination of dedicated hardware and computer instructions.

Embodiments of the present invention may be implemented via hardware, software or combination of hardware and software. In some embodiments, software implementation comprises but not limited to firmware, resident software, microcode and so on.

A computer readable medium may be employed to provide program code. The computer readable medium may be any suitable physical device. The computer readable medium may be an electrical device, a magnetic device, an optical device, an electromagnetic device, an infrared device or a semi-conductive device. For example, the computer readable medium may comprise semiconductor memory, solid-state storage, magnetic tape, removable disk, random access memory, read-only memory, hard disk, and compact disc (e.g., compact disc read-only memory, rewritable compact disk, and digital video disk).

The above description and discussion about specific embodiments about the present technology is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

I claim:

1. A power loss control method for a MOS unit, wherein the MOS unit comprises a plurality of MOS devices coupled in parallel, the power loss control method comprising:
    detecting a load condition of the MOS unit and designating the load condition as either a light load condition or a heavy load condition; and
    adjusting driving loss of the MOS unit based on the load condition designation via controlling the MOS unit; and wherein
    the driving loss of the MOS unit is configured to decrease via controlling the MOS unit when the load condition of the MOS unit is designated as a light load condition; and wherein the power loss control method further comprising
    providing a driving signal to the MOS unit, wherein controlling the MOS unit under a designated light load condition comprises decreasing voltage of the driving signal.

2. The power loss control method of claim 1, wherein controlling the MOS unit under a designated light load condition comprises shielding one or more MOS devices of the MOS unit.

3. The power loss control method of claim 2, further comprising releasing the shielded one or more MOS devices when the MOS unit transits from the designated light load condition to a designated heavy load condition.

4. The power loss control method of claim 1, further comprising providing a plurality of driving signals to the plurality of MOS devices, wherein controlling the MOS unit under a designated light load condition comprises deactivating one or more of the plurality of driving signals.

5. The power loss control method of claim 1, further comprising increasing voltage of the driving signal when the MOS unit transits from a designated light load condition to a designated heavy load condition.

6. The power loss control method of claim 1, wherein controlling the MOS unit under a designated heavy load condition comprises maintaining or resuming an initial configuration of the MOS unit.

7. The power loss control method of claim 1, wherein detecting the load condition comprises monitoring working state of a major device, wherein the major device comprising the MOS unit.

8. The power loss control method of claim 1, wherein detecting the load condition comprises monitoring an electrical parameter of the MOS unit.

9. A power loss control apparatus for a MOS unit, wherein the MOS unit comprises a plurality of MOS devices coupled in parallel, the power loss control apparatus comprising:
    a load condition detecting device, configured to detect a load condition of the MOS unit and designate the load condition as either a light load condition or a heavy load condition; and
    a power loss controlling device, configured to adjust a driving loss of the MOS unit based on the load condition designation; and wherein the driving loss of the MOS unit is configured to decrease when the MOS unit is under a designated light load condition; wherein
    the power loss controlling device comprises a driving voltage controlling device, wherein the driving voltage controlling device is configured to decrease voltage of a driving signal of the MOS unit under the designated light load condition.

10. The power loss control apparatus of claim 9, wherein the power loss controlling device comprises a shielding device, wherein the shielding device is configured to shield one or more MOS devices of the MOS unit under the designated light load condition.

11. The power loss control apparatus of claim 10, wherein the shielding device is configured to release the shielded one or more MOS devices when the MOS unit transits from the designated light load condition to a designated heavy load condition.

12. The power loss control apparatus of claim 10, wherein the shielding device is configured to shield the one or more MOS devices via providing one or more deactivated driving signals to the one or more MOS devices.

13. The power loss control apparatus of claim 9, wherein the driving voltage controlling device is configured to increase voltage of the driving signal of the MOS unit when the MOS unit transits from the designated light load condition to a designated heavy load condition.

14. The power loss control apparatus of claim 9, wherein the load condition detecting device is configured to detect the load condition via monitoring an electrical parameter of the MOS unit.

15. An apparatus, comprising:
- a MOS unit, comprising a plurality of MOS devices coupled in parallel, wherein each MOS device having a first terminal, a second terminal and a control terminal, wherein the first terminals of the plurality of MOS devices are coupled together, and wherein the second terminals of the plurality of MOS devices are coupled with each other; and
- a control circuit, having an output configured to provide a control signal, wherein the control signal is configured to adjust a driving loss of the MOS unit based on a load condition of the apparatus; wherein the apparatus further comprises a first driving circuit, the first driving circuit having a first input, a second input, and an output, wherein the first input is coupled to the output of the control circuit to receive the control signal, wherein the second input is configured to receive a pulse signal, wherein the output is coupled to the control terminals of the plurality of MOS devices to provide a first driving signal, and wherein voltage of the first driving signal is configured to decrease when the apparatus operates under a light load condition.

16. The apparatus of claim 15, wherein the control circuit is configured to decrease the driving loss of the MOS unit when the apparatus operates under a light load condition.

17. The apparatus of claim 15, wherein the apparatus further comprises
- a second driving circuit, having an input and an output, wherein the input is configured to receive a pulse signal, and the output is coupled to the control terminal of one or more MOS devices to provide a second driving signal; and
- a third driving circuit, having a first input, a second input and an output, wherein the first input is coupled to the output of the control circuit to receive the control signal, the second input is configured to receive the pulse signal, and the output is coupled to the control terminal of one or more MOS devices to provide a third driving signal; and wherein the third driving signal is deactivated when the apparatus operates under a light load condition, and the third driving signal is activated when the apparatus operates under a heavy load condition.

\* \* \* \* \*